US007691755B2

(12) United States Patent
Li et al.

(10) Patent No.: US 7,691,755 B2
(45) Date of Patent: Apr. 6, 2010

(54) PLASMA IMMERSION ION IMPLANTATION WITH HIGHLY UNIFORM CHAMBER SEASONING PROCESS FOR A TOROIDAL SOURCE REACTOR

(75) Inventors: Shijian Li, San Jose, CA (US); Lily L. Pang, Fremont, CA (US); Majeed A. Foad, Sunnyvale, CA (US); Seon-Mee Cho, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 302 days.

(21) Appl. No.: 11/748,783

(22) Filed: May 15, 2007

(65) Prior Publication Data
US 2008/0286982 A1 Nov. 20, 2008

(51) Int. Cl.
H01L 21/00 (2006.01)
H01L 21/26 (2006.01)
(52) U.S. Cl. ............... 438/778; 438/758; 257/E21.002
(58) Field of Classification Search ............. 438/782, 438/758, 787, 788, 778; 257/E21.002
See application file for complete search history.

(56) References Cited

U.S. PATENT DOCUMENTS 6,125,788 A * 10/2000 Hills et al. ............. 156/345.51
6,197,123 B1 * 3/2001 Poag et al. ..................... 134/18
2003/0180459 A1 * 9/2003 Redeker et al. .......... 427/248.1
2005/0191827 A1 * 9/2005 Collins et al. ............... 438/513

* cited by examiner

Primary Examiner—Matthew Smith
Assistant Examiner—Michele Fan
(74) Attorney, Agent, or Firm—Law Office of Robert M. Wallace

(57) ABSTRACT

A method is provided for performing plasma immersion ion implantation with a highly uniform seasoning film on the interior of a reactor chamber having a ceiling and a cylindrical side wall and a wafer support pedestal facing the ceiling. The method includes providing a gas distribution ring with plural gas injection orifices on a periphery of a wafer support pedestal, the orifices facing radially outwardly from the wafer support pedestal. Silicon-containing gas is introduced through the gas distribution orifices of the ring to establish a radially outward flow pattern of the silicon-containing gas. The reactor includes pairs of conduit ports in the ceiling adjacent the side wall at opposing sides thereof and respective external conduits generally spanning the diameter of the chamber and coupled to respective pairs of the ports. The method further includes injecting oxygen gas through the conduit ports into the chamber to establish an axially downward flow pattern of oxygen gas in the chamber. RF power is coupled into the interior of each of the conduits to generate a toroidal plasma current of $Si_xO_y$ species passing through the chamber to deposit a seasoning layer of a $Si_xO_y$ material on surfaces within the chamber, while leaving the pedestal without a wafer so as to expose a wafer support surface of the pedestal.

16 Claims, 4 Drawing Sheets

US 7,691,755 B2

PLASMA IMMERSION ION IMPLANTATION WITH HIGHLY UNIFORM CHAMBER SEASONING PROCESS FOR A TOROIDAL SOURCE REACTOR

BACKGROUND

Plasma immersion ion implantation of a semiconductor wafer is typically used to form P—N junctions in the wafer surface. The plasma immersion ion implantation (P3i) process is faster or more productive than other implantation processes. In order to attain a requisite implantation or junction depth, ion energy at the wafer surface must relatively high, which can be accomplished by applying a sufficiently high RF bias power to the wafer, or to an electrode within the wafer support pedestal. The P3i reactor chamber is typically constructed of aluminum components whose surfaces are anodized to provide some protection and from plasma in the chamber. One problem is that the high ion energy of the plasma during ion implantation produces ion bombardment of the metallic chamber components, removing metal particles that vaporize into the plasma to spread throughout the chamber and deposit on the wafer. The high ion energy is attained by coupling RF bias power to the wafer at a sufficient level to create a plasma bias voltage on the order of tens or hundreds of kilovolts. Such metal contamination of the wafer can produce defects in the devices formed on the wafer surface.

SUMMARY OF THE INVENTION

A method is provided for performing plasma immersion ion implantation with a highly uniform seasoning film on the interior of a reactor chamber having a ceiling and a cylindrical side wall and a wafer support pedestal facing the ceiling. The method includes providing a gas distribution ring with plural gas injection orifices on a periphery of a wafer support pedestal, the orifices facing radially outwardly from the wafer support pedestal. Silicon-containing gas is introduced through the gas distribution orifices of the ring to establish a radially outward flow pattern of the silicon-containing gas. The reactor includes pairs of conduit ports in the ceiling adjacent the side wall at opposing sides thereof and respective external conduits generally spanning the diameter of the chamber and coupled to respective pairs of the ports. The method further includes injecting oxygen gas through the conduit ports into the chamber to establish an axially downward flow pattern of oxygen gas in the chamber. RF power is coupled into the interior of each of the conduits to generate a toroidal plasma current of $Si_xO_y$ species passing through the chamber to deposit a seasoning layer of a $Si_xO_y$ material on surfaces within the chamber, while leaving the pedestal without a wafer so as to expose a wafer support surface of the pedestal. Upon completion of seasoning layer deposition, a wafer is placed on the pedestal. Ion implantation precursor gases are introduced into the chamber through a gas distribution plate that extends across the ceiling. Plasma immersion ion implantation is performed by coupling RF power into the interior of each of the conduits to generate a toroidal plasma of implant species current passing through the chamber so as to implant the implant species into the wafer. The method can further include applying RF bias power to an electrode underlying the wafer to produce a plasma sheath bias voltage on the order of kilovolts.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION OF THE INVENTION

Figure 1:
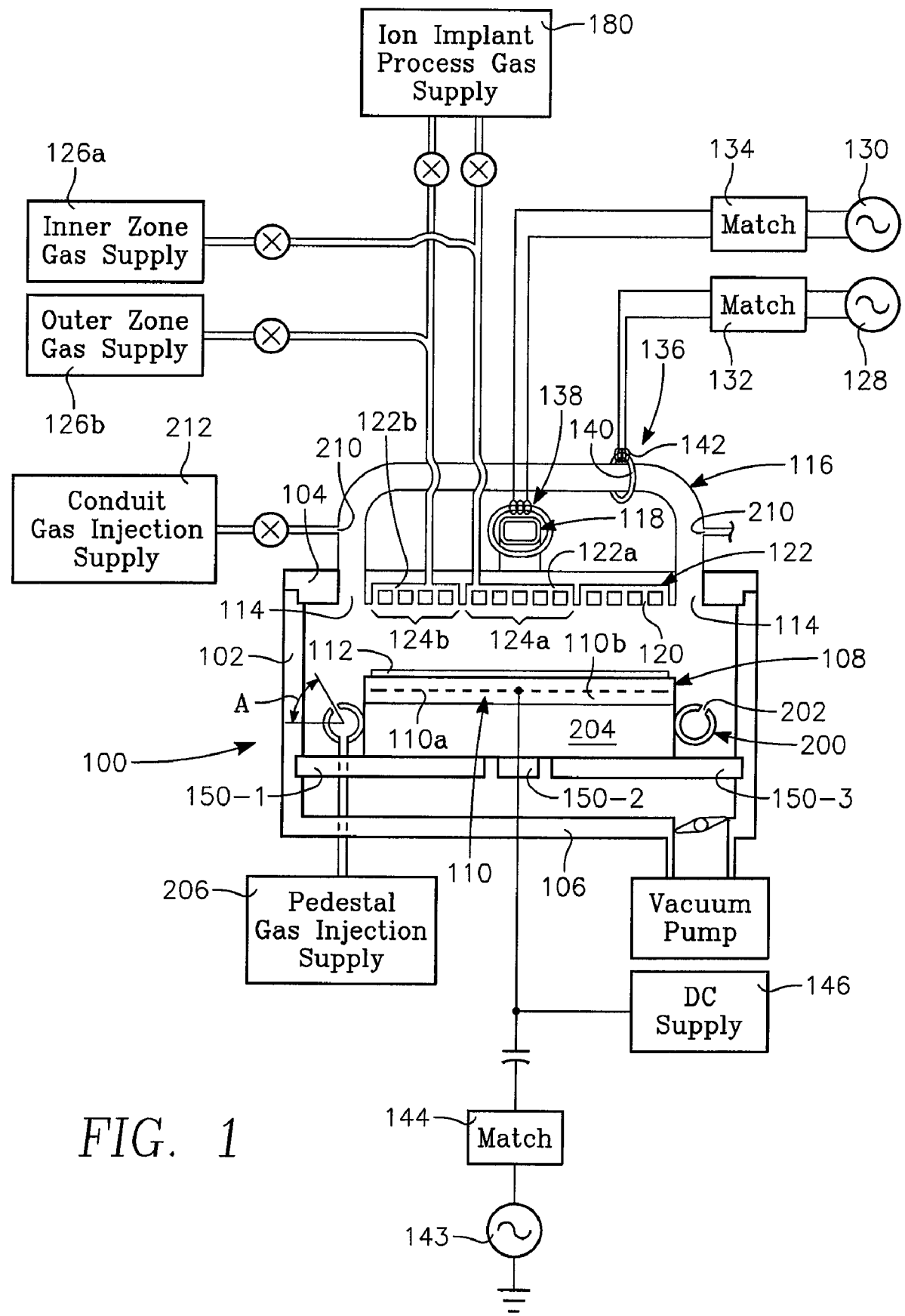
FIG. 1 is a cut-away side view of a plasma reactor in accordance with one aspect.

In order to minimize or prevent metal contamination from occurring during the P3i process, the chamber interior surfaces can be coated with a non-metallic "seasoning" film prior to the plasma immersion ion implantation and prior to introduction of the wafer into the chamber. The ideal thickness of the seasoning film, at which metal contamination is reduced below specified limits, is readily determined using empirical methods. Typically, the minimum thickness is on the order of 1000 Å, although better result are obtained at more ideal thicknesses, such as 2000 Å. The seasoning film must be removed following the P3i process and thereafter replaced because some of the film is removed—or its thickness reduced—in a non-uniform manner during the P3i process, so that it may not offer adequate protection from metal contamination during a subsequent P3i step. This is particularly true of cases in which the ion implantation plasma is formed of a gas including a fluoride compound of the ion implantation species. The seasoning film removal step can be carried out by filling the chamber with seasoning-removal gas species obtained from an external ("downstream") plasma source. Such gases may be corrosive species such as fluorine-containing compounds, for example.

The seasoning film is deposited using a high density plasma enhanced chemical vapor deposition (HDPCVD) process by introducing a silicon-containing gas (e.g., silane) and oxygen gas into the reactor chamber and igniting a plasma. Radicals, neutrals and/or ions of silicon-oxygen compounds are formed in the plasma, which deposit on the interior chamber surfaces to form a thin film or coating of $SiO_2$ and/or $Si_xO_y$, for example. The problem is that the thickness of the seasoning film is highly non-uniform because of non-uniformities in gas flow, non-uniform RF power or field distribution throughout the chamber and obstructions offered by some mechanical features in the chamber interior. For chamber surfaces in areas of lower gas flow, where the seasoning film deposition rate is slowest, the minimum required seasoning film thickness (e.g., 1000 Å) is not reached until an excessive seasoning film thickness (e.g., 12,000 Å) is reached in other areas of high gas flow and the highest deposition rates. The result is that the seasoning deposition step takes longer than it should—depressing productivity. Moreover, the post-implant seasoning removal process exposes the chamber interior surfaces where the seasoning film was thinnest (1000 Å) well before removal of the thicker (12,000 Å) portions of the seasoning film. The chamber surfaces first exposed during the post-implant seasoning removal step are therefore attacked by the cleaning gases during the remainder of the cleaning step, shortening the life of those components and increasing the operating cost of the reactor.

A related problem arises from the non-uniform distribution of the removal rate of the seasoning film during the P3i process and during the post-implant seasoning removal (clean) process. The removal rate during the P3i step is not uniform, because the P3i plasma is concentrated primarily in the wafer-ceiling gap or process zone. In cases, for example, where the seasoning precursor gas is introduced from the chamber bottom, bottom-facing surfaces of some chamber components, such as radial struts supporting the wafer pedestal, receive the thickest coating. Unfortunately, these surfaces face away from the main plasma (i.e., away from the wafer-ceiling gap) and therefore receive little ion bombardment, and are therefore the least reduced in thickness during the P3i step. Having started out with the greatest seasoning thickness and then having been attacked the least during the P3i step, such surfaces bear a disproportionately thick seasoning film and are therefore difficult to clean without undue exposure of other chamber surfaces to corrosive cleaning gases.

FIG. 1 illustrates a toroidal source plasma reactor for plasma immersion ion implantation having gas distribution features that solve the foregoing problems. These gas distribution features are used during the pre-implant seasoning deposition step to form a seasoning film throughout the chamber interior that is highly uniform. Some of the features may be used to control the stochiometry of the seasoning film to achieve desired characteristics, as will be discussed herein.

Figure 2:
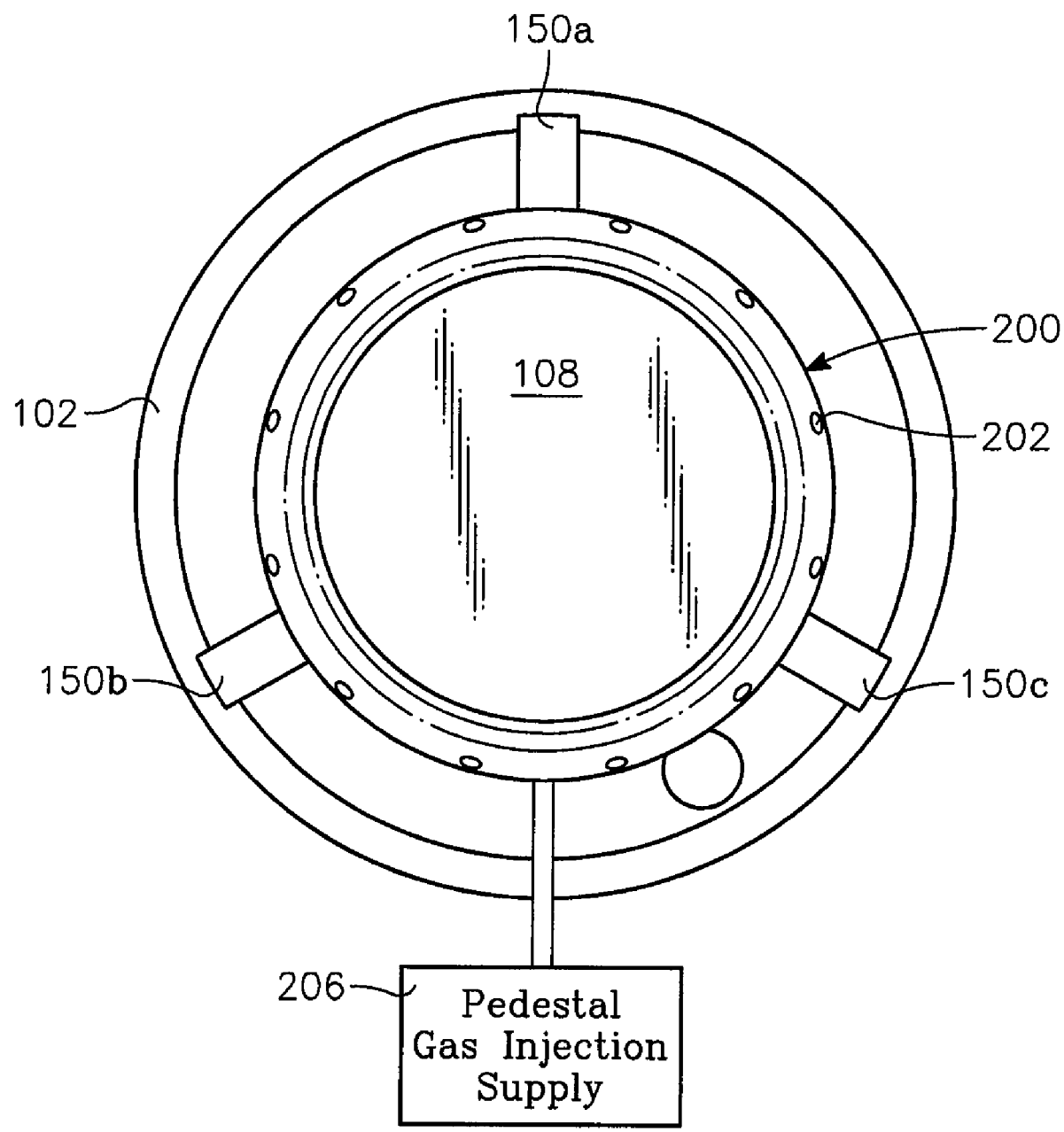
FIG. 2 is a cut-away top view corresponding to FIG. 1.

The reactor of FIG. 1 includes a cylindrical chamber 100 defined by a cylindrical side wall 102, a ceiling 104 and a floor 106. A wafer support pedestal 108 includes an electrostatic chuck 110 having a wafer support surface for holding a semiconductor wafer 112. The ceiling 104 has two pairs of openings 114 to which respective mutually orthogonal external reentrant conduits 116, 118 are coupled. Each conduit 116, 118 completes a closed reentrant path for an oscillating plasma current passing through the process region defined by the gap between the pedestal 108 and the ceiling 104. The ceiling 104 is a gas distribution plate having an array of gas injection orifices 120 facing the chamber interior and an interior gas distribution manifold 122. Optionally, the manifold 122 may be divided into radially inner and outer portions 122a, 122b, to establish independent inner and outer gas injection zones (or groups) 124a, 124b of the orifices 122. In this case, a pair of separately controlled gas supplies 126a, 126b are coupled to the inner and outer manifolds 122a, 122b. A pair of plasma RF source power generators 128, 130 are coupled to apply RF power to the interiors of respective ones of the conduits 116, 118 via respective impedance matches 132, 134 and power applicators 136, 138. Each power applicator 136, 138 may be of the same structure which consists of a magnetically permeable core or ring 140 wrapped around the respective conduit 116 or 118, and a conductive coil 142 wrapped around the ring 140. The electrostatic chuck (ESC) 110 consists of a conductive electrode 110a and an insulator layer 110b in which the electrode 110a is contained. An RF bias power generator 142 is coupled to the ESC electrode 110a through an impedance match 144. A D.C. chuck voltage supply 146 is coupled to the ESC electrode 110a. The pedestal 108 is supported on three radial struts 150-1, 150-2, 150-3, best shown in FIG. 2, that extend inwardly from the side wall 102 and underneath the pedestal 108.

During plasma immersion ion implantation, an implant species precursor gas, such as a boron fluoride or a boron hydride in the case of a boron implantation step, is injected through the ceiling gas distribution plate 104 while plasma source power is applied by the generators 128, 130 to produce an oscillating closed plasma current in the reentrant path through the process region overlying the wafer. For this purpose, an ion implantation process gas supply 180 is coupled to the inner and outer gas manifolds 122a, 122b of the gas distribution plate 104. Optionally, the RE generator 143 applies bias power to the ESC 110 to control ion energy and (hence) implant depth. The gas distribution plate 104 is optimized for uniform gas distribution across the surface of the wafer or wafer support surface of the ESC 110, but is not structured for uniform gas distribution throughout the chamber interior. Therefore, the gas distribution plate 104 is not, by itself, suitable for use in depositing the seasoning film throughout the chamber.

The gas distribution features that provide for a uniform seasoning film in the chamber include a center array of gas injection orifices 202 along the side wall of the pedestal 108 for injecting the silicon-containing gas. The center array of orifices 202 is formed in a hollow gas distribution ring 200 supported on the side wall of the pedestal 108 and extending around the periphery of the pedestal. In the illustrated embodiment, the pedestal 108 supports an electrostatic chuck (ESC) 110. The ESC includes a conductive base 204 underlying the insulating layer 110. The base 204 may include internal features for utilities such as coolant passages and backside gas flow passages (not shown). In the illustrated embodiment, the gas distribution ring 200 is attached to the outer periphery of the base 204. The gas injection orifices 202 on the ring 200 may be oriented at an angle A relative to the horizontal wafer plane so as to inject the silicon-containing gas at an upward direction. This promotes better deposition on upward facing surfaces of interior chamber features, such as the wafer support surface of the ESC 110 and the top surfaces of the radial struts 150, for example. A silicon-containing (e.g., silane) gas supply 206 is connected to the hollow interior of the gas distribution ring 200.

The oxygen gas is injected during the seasoning film deposition step through the four conduit ports 114 in the ceiling 104. For this purpose, conduit injection orifices 210 inject gas into the conduits 116, 118 near each of the conduit ports 114. An oxygen gas supply 212 is coupled to each of the conduit injection orifices. Oxygen injection through the conduit ports 114 promotes a more oxygen-rich gas mixture near the sides of the chamber and, therefore, a more silicon-rich gas mixture over the center of the chamber, i.e., over the wafer support surface of the ESC 110. This is because the conduit ports 114 are all located near the periphery of the ceiling 104.

Figure 3:
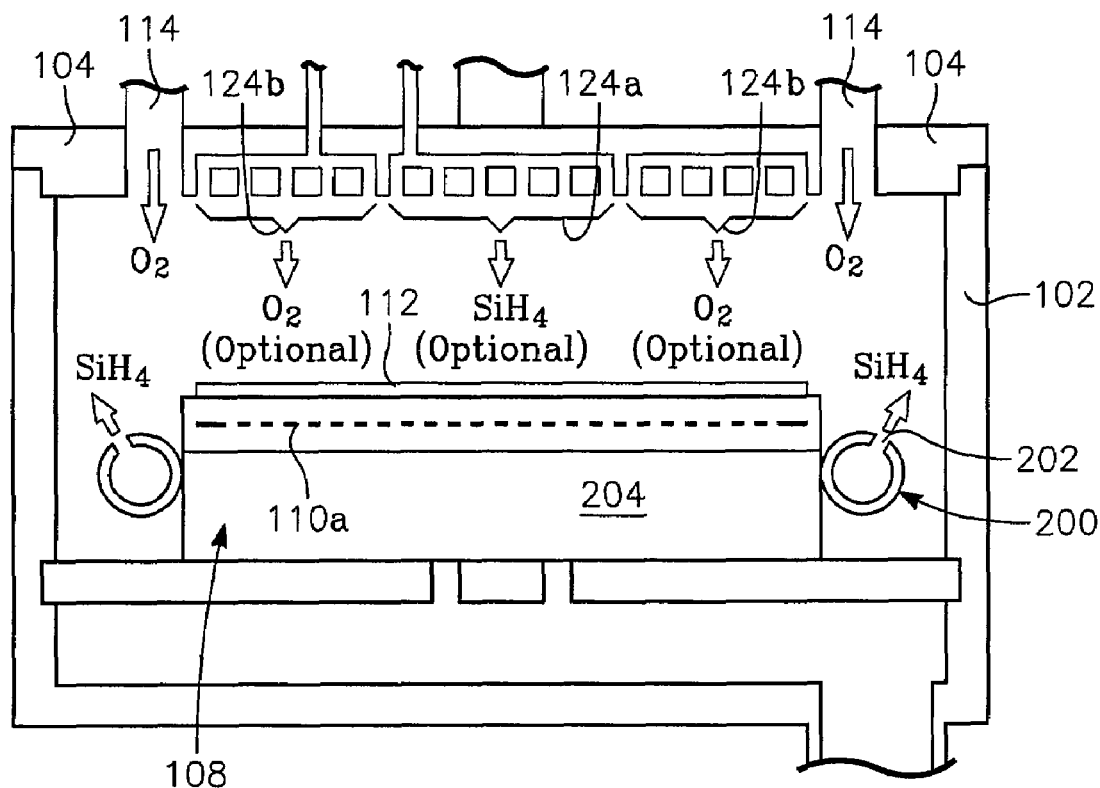
FIG. 3 is a simplified diagram corresponding to FIG. 1 showing the gas flow pattern by species.

During the pre-implant seasoning film deposition step, the wafer 112 is absent and no implant process gases are supplied to the gas distribution plate 104. Therefore, the gas distribution plate 104 is available for use during the seasoning film deposition step. Optionally, the gas distribution plate 104 may be exploited during the seasoning film deposition to control the thickness distribution and the stochiometry distribution of the seasoning layer. For example, a further increase in the silicon content of the gases over the center of the chamber (over the pedestal 108) can be realized by injecting the silicon-containing gas (silane) through the center (inner) gas distribution zone 124 of the gas distribution plate 104. For this purpose, the inner zone gas supply 126a stores silane, for example. To promote a thicker film on upward facing surface without detracting from the predominance of silicon-containing gas at the center, oxygen gas could be injected through the outer gas injection zone 124b of the gas distribution plate 104. In this case, the outer zone gas supply 126b stores oxygen gas. The proportion of silicon to oxygen in the center and periphery of the chamber is controlled or affected by the different gas flow rates to the inner and outer zones 122a, 122b as well as the gas flow rates to the conduit injection orifices 210 and to the gas distribution ring 200. FIG. 3 summarizes the foregoing gas flows by species from each of the gas injection elements of the reactor of FIG. 1.

The position (e.g., axial height) of the gas distribution ring 200 and the angle A of the orifices 202 of the gas distribution ring 200 can be adjusted to achieve a desired uniformity of the coating of $Si_xO_y$. Oxygen and SiH4 can be supplied at a controlled rate to the distribution ring 200 for injection through the orifices 202 in order to control the stochiometry of the coating or seasoning deposition.

We have found that the foregoing features solve the problem non-uniform seasoning deposition. Whereas prior to the invention the seasoning thickness varied from a minimum of about 1000 Å on some upward facing surfaces to a maximum of about 12,000 Å on some downward facing surfaces, the invention produces a much smaller variation in seasoning thickness, permitting us to establish a much greater minimum thickness (of about 2000 Å) without exceeding a maximum of about 3000-4000 Å. This greater minimum thickness is achieved in a much shorter deposition time, while the removal step is performed very quickly, thus increasing throughput.

Figure 4:
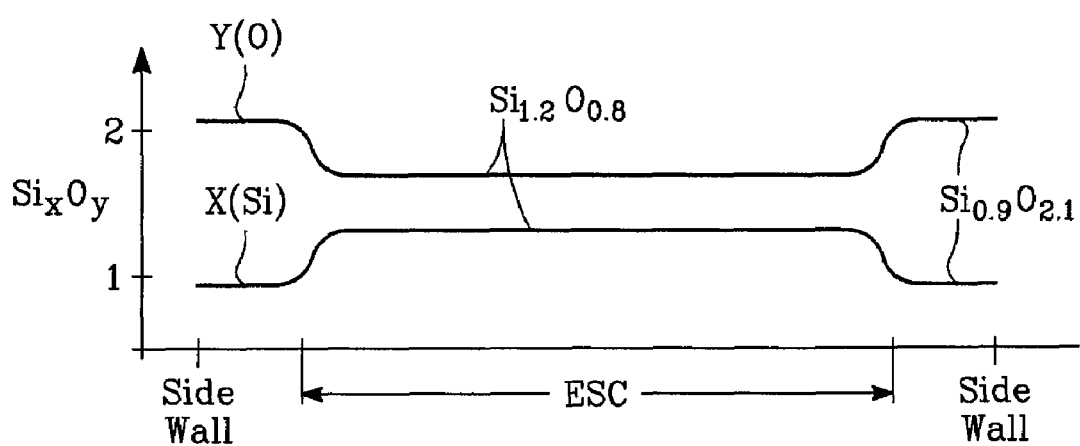
FIG. 4 is a graph depicting the variations in stochiometry of a seasoning layer controlled in accordance with the gas flow patterns of FIG. 3.

FIG. 4 is a graph depicting a desired radial distribution of Si—O stochiometry of the seasoning layer that can be controlled with the foregoing gas distribution features. Specifically, by providing more silane (silicon-containing) gas over the wafer pedestal 108 and more oxygen gas at the periphery, the stochiometry of the $Si_xO_y$ seasoning film (i.e., the ratio x:y) is distributed so as to have a silicon-rich proportion at the center and a silicon-lean proportion at the periphery. The advantage is that a material with a higher conductivity is provided where it is needed, i.e., on the ESC 110. The higher conductivity of the silicon-rich mixture covering the ESC 110 enables the electric charge on the wafer to be removed more rapidly during de-chucking of the wafer, leading the better throughput or productivity. By providing a more conductive path for charge on the wafer to dissipate, the electrostatic clamping force holding the wafer to the ESC 110 is more rapidly removed when the D.C. chucking voltage source is switched off to dechuck the wafer. In FIG. 4, the proportion (x) of silicon is maximum over the pedestal 108 while the proportion (y) of oxygen is minimum in the same area. The relationship is reversed at the periphery, as indicated in the graph of FIG. 4. A nominal value for x is 1 while a nominal value for y is 2. The stochiometric variation illustrated in the graph of FIG. 4 between the radially inner and outer regions of the deposited seasoning film is increased by increasing the flow of the silicon-containing gas to the center (e.g., through the gas distribution plate 104 or through the gas distribution ring 200) relative to the oxygen gas flow to the periphery (e.g., through the conduit ports 114).

Figure 5:
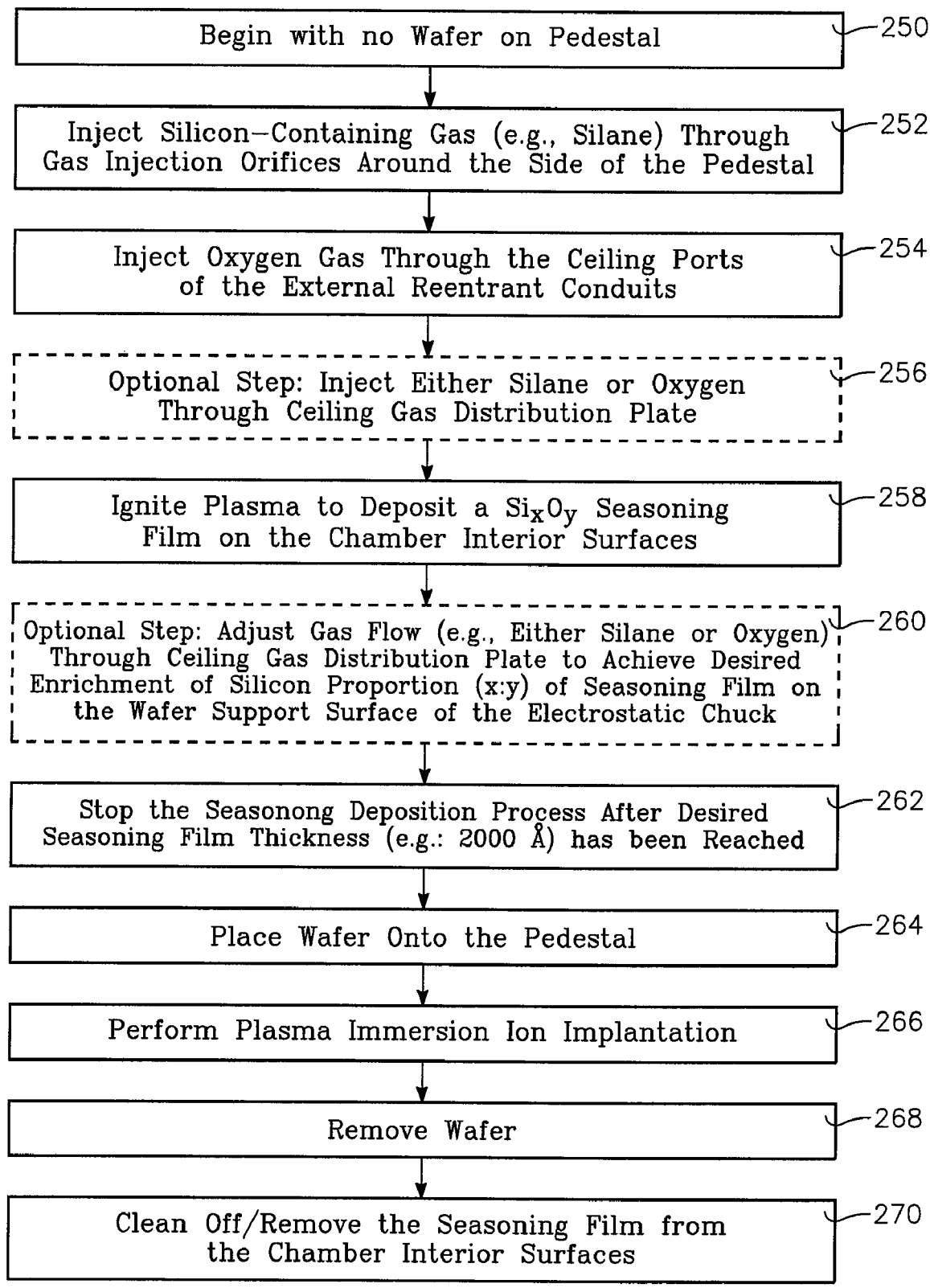
FIG. 5 is a diagram depicting a process performed by the reactor of FIG. 1.

FIG. 5 depicts a process involving pre-implant seasoning deposition, plasma immersion ion implantation and post-implant cleaning or seasoning removal. The entire cycle begins with no wafer on the pedestal 108 (block 250 of FIG. 5). For pre-implant seasoning deposition, a silicon-containing gas (e.g., silane) is injected through gas injection orifices 202 around the side of the pedestal 108 (block 252) and oxygen gas is injected through the ceiling ports 114 of the external reentrant conduits 116, 118 (block 254). An optional step (block 256) is to inject either silane or oxygen through ceiling gas distribution plate 104. In the case of silane, the flow rate is adjusted to achieve about a 2-10% enhancement of the silicon content of the seasoning layer deposited on the ESC 110 over the nominal 1:2 silicon-to-oxygen ratio of silicon dioxide. A plasma is generated (by applying RF power either to the applicators 136, 138 or to the ESC electrode 110a, to deposit a $Si_xO_y$ seasoning film on chamber interior surfaces (block 258). An optional step (block 260) is to adjust gas flow (e.g., either silane or oxygen) through ceiling gas distribution plate 104 to achieve desired enrichment of silicon proportion (x:y) of seasoning film on the wafer support surface of the electrostatic chuck, in accordance with FIG. 4. Then, the seasoning deposition process is stopped after desired seasoning film thickness (e.g., 2000 Å) has been reached (block 262). A wafer is placed onto the pedestal 108 (block 264). Plasma immersion ion implantation is performed (block 266) by introducing an implant species-containing process gas and applying RF source power to the conduit RF power applicators 136, 138. During this step, ion energy (implant depth) may be controlled by applying RF bias power to the ESC electrode 110a from the generator 142. Upon completion of the implant step, wafer is removed (block 268). The seasoning film is removed (block 270) by introducing a seasoning layer etch gas from a downstream plasma source, for example.

While the foregoing is directed to embodiments of the invention, other and further embodiments of the invention may be devised without departing from the basic scope thereof, and the scope thereof is determined by the claims that follow.

What is claimed is:

1. A method for performing plasma immersion ion implantation in a reactor chamber having a ceiling and a cylindrical side wall and a workpiece support having a peripheral sidewall substantially perpendicular to said ceiling, comprising
    supporting a gas distribution ring having plural gas injection orifices on an exterior surface of said peripheral side wall of said workpiece support pedestal, said orifices facing radially outwardly from said workpiece support pedestal, and locating said plural gas injection orifices radially outwardly of said peripheral side wall;
    providing a gas distribution plate at said ceiling;
    introducing a silicon-containing gas through the gas distribution orifices of said ring to establish a radially outward flow pattern of said silicon-containing gas;
    providing pairs of conduit ports in said ceiling adjacent the cylindrical sidewall at opposing sides thereof and locating said conduit ports radially outside of a diameter of said gas distribution plate, and providing respective external conduits generally spanning the diameter of said chamber and coupled to respective pairs of said ports;
    injecting oxygen gas from an oxygen gas supply through the conduit ports into said chamber to establish an axially downward flow pattern of oxygen gas in the chamber;
    coupling RF power into the interior of each of said conduits to generate a toroidal plasma current of $Si_xO_y$ species passing through said chamber to deposit a seasoning layer of a $Si_xO_y$ material on surfaces within said chamber, while leaving said pedestal without a workpiece so as to expose a workpiece support surface of the pedestal;

placing a workpiece on the pedestal;

introducing ion implantation precursor gases into the chamber through a gas distribution plate that extends across the ceiling; and coupling RF power into the interior of each of said conduits to generate a toroidal plasma of implant species current passing through said chamber so as to implant said implant species into said workpiece.

2. The method of claim 1 further comprising applying RF bias power to an electrode to produce a plasma sheath bias voltage on the order of kilovolts.

3. The method of claim 1 wherein said pedestal comprises an electrostatic chuck, said method further comprising enhancing the electrical conductivity of the portion of the seasoning layer deposited on said workpiece support surface relative that deposited on other places in said chamber sufficiently to provide a conductive path for discharging the workpiece to electrostatically de-clamp the workpiece from the workpiece support surface.

4. The method of claim 3 wherein the step of enhancing the electrical conductivity comprises adjusting the flow rates of said silicon-containing gas and said oxygen gas in said chamber so as to deposit a silicon-rich form of $Si_xO_y$ on the workpiece support surface of said pedestal and an oxygen-rich form of $Si_xO_y$ on chamber surfaces near said side wall.

5. The method of claim 4 wherein the step of adjusting comprises injecting a silicon-containing gas through the gas distribution plate.

6. The method of claim 5 wherein said gas distribution plate comprises inner and outer gas injection zones, said silicon-containing gas being injected through said inner gas injection zone, said process further comprising injecting oxygen gas through said outer injection zone.

7. The method of claim 1 further comprising orienting said orifices of said gas distribution ring in a direction toward the workpiece support plane of said pedestal.

8. The method of claim 1 further comprising locating said orifices below the workpiece support surface of said workpiece support pedestal.

9. A method for performing plasma immersion ion implantation in a reactor chamber having a ceiling and a cylindrical side wall and a workpiece support said workpiece support pedestal having a peripheral side wall substantially perpendicular to said ceiling, comprising introducing a silicon-containing gas through radially facing gas distribution orifices supported on and radially outside of the peripheral side wall of said workpiece support pedestal to establish a radially outward flow pattern of said silicon-containing gas;

injecting oxygen gas through conduit ports of reentrant conduits of said chamber to establish an axially downward flow pattern of oxygen gas in a peripheral region of the chamber;

coupling RF power into the interior of each of said conduits to generate a toroidal plasma current of $Si_xO_y$ species passing through said chamber to deposit a seasoning layer of a $Si_xO_y$ material on surfaces within said chamber, while leaving said pedestal without a workpiece so as to expose a workpiece support surface of the pedestal;

placing a workpiece on the pedestal;

introducing ion implantation precursor gases into the chamber through a gas distribution plate that extends across the ceiling; and coupling RF power into the interior of each of said conduits to generate a toroidal plasma of implant species current passing through said chamber so as to implant said implant species into said workpiece.

10. The method of claim 9 further comprising applying RF bias power to an electrode to produce a plasma sheath bias voltage on the order of kilovolts.

11. The method of claim 9 wherein said pedestal comprises an electrostatic chuck, said method further comprising enhancing the electrical conductivity of the portion of the seasoning layer deposited on said workpiece support surface sufficiently to provide a conductive path for discharging the workpiece to electrostatically de-clamp the workpiece from the workpiece support surface.

12. The method of claim 11 wherein the step of enhancing the electrical conductivity comprises adjusting the flow rates of said silicon-containing gas and said oxygen gas in said chamber so as to deposit a silicon-rich form of $Si_xO_y$ on the workpiece support surface of said pedestal and an oxygen-rich form of $Si_xO_y$ on chamber surfaces near said side wall.

13. The method of claim 12 wherein the step of adjusting comprises injecting a silicon-containing gas through the gas distribution plate.

14. The method of claim 13 wherein said gas distribution plate comprises inner and outer gas injection zones, said silicon-containing gas being injected through said inner gas injection zone, said process further comprising injecting oxygen gas through said outer injection zone.

15. The method of claim 9 further comprising angling said radially outwardly facing orifices in an upward direction toward the workpiece support plane of said pedestal whereby to establish an axial component in said radially outward flow pattern.

16. The method of claim 9 further comprising locating said orifices below the workpiece support surface of said workpiece support pedestal.

* * * * *